(12) United States Patent
Zhang et al.

(10) Patent No.: US 10,559,696 B2
(45) Date of Patent: Feb. 11, 2020

(54) HYBRID CMOS DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Liangfen Zhang, Guangdong (CN); Yuanjun Hsu, Guangdong (CN); Jangsoon Im, Guangdong (CN); Yuanchun Wu, Guangdong (CN); Poyen Lu, Guangdong (CN); Boru Yang, Guangdong (CN); Changdong Chen, Guangdong (CN); Chuan Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 67 days.

(21) Appl. No.: 15/744,811

(22) PCT Filed: Nov. 25, 2017

(86) PCT No.: PCT/CN2017/112969
§ 371 (c)(1),
(2) Date: Jan. 14, 2018

(87) PCT Pub. No.: WO2019/071750
PCT Pub. Date: Apr. 18, 2019

(65) Prior Publication Data
US 2019/0109238 A1    Apr. 11, 2019

(30) Foreign Application Priority Data
Oct. 11, 2017   (CN) .......................... 2017 1 0943188

(51) Int. Cl.
*H01L 27/12*    (2006.01)
*H01L 29/786*   (2006.01)
(Continued)

(52) U.S. Cl.
CPC .. *H01L 29/7869* (2013.01); *H01L 21/823807* (2013.01); *H01L 21/823828* (2013.01);
(Continued)

(58) Field of Classification Search
CPC ......... H01L 29/7869; H01L 21/823807; H01L 27/1251; H01L 27/0922; H01L 21/823828;
(Continued)

(56) References Cited

U.S. PATENT DOCUMENTS

2004/0129979 A1    7/2004  Park et al.
2005/0176194 A1*   8/2005  Sasaki ................. H01L 21/8221
                                                            438/197

(Continued)

FOREIGN PATENT DOCUMENTS

CN    102184968       9/2011
CN    103000632 A     3/2013
(Continued)

*Primary Examiner* — Bitew A Dinke
(74) *Attorney, Agent, or Firm* — Hemisphere Law, PLLC; Zhigang Ma

(57) ABSTRACT

The disclosure provides a hybrid CMOS device and a manufacturing method thereof. The manufacturing method of the hybrid CMOS device according to the disclosure uses a low-temperature polysilicon to prepare an active layer of a PMOS transistor, and simultaneously uses a metal oxide semiconductor to prepare an active layer of an NMOS transistor. The two types of semiconductor materials are used in combination to form a hybrid CMOS device. Compared with the existing method for producing an active layer of the PMOS transistor by using a two-dimensional carbon (Continued)

nanotransister material or an organic semiconductor material, the hybrid CMOS device obtained according to the disclosure has superior electrical properties.

5 Claims, 10 Drawing Sheets

(51) Int. Cl.
*H01L 27/092* (2006.01)
*H01L 21/8238* (2006.01)

(52) U.S. Cl.
CPC ........ *H01L 27/092* (2013.01); *H01L 27/0922* (2013.01); *H01L 27/1203* (2013.01); *H01L 27/127* (2013.01); *H01L 27/1225* (2013.01); *H01L 27/1251* (2013.01)

(58) Field of Classification Search
CPC .............. H01L 27/092; H01L 27/1203; H01L 27/3251; H01L 27/3274; H01L 29/4908; H01L 51/0508
See application file for complete search history.

(56) References Cited

U.S. PATENT DOCUMENTS

| | | | |
|---|---|---|---|
| 2010/0176395 A1 | 7/2010 | Choi et al. | |
| 2010/0182223 A1* | 7/2010 | Choi | G09G 3/3233 345/76 |
| 2013/0168666 A1* | 7/2013 | Yan | H01L 27/1225 257/43 |
| 2014/0159038 A1* | 6/2014 | Im | H01L 27/1225 257/43 |
| 2015/0055047 A1* | 2/2015 | Chang | H01L 27/3262 349/43 |
| 2015/0055051 A1* | 2/2015 | Osawa | H01L 27/1225 349/48 |
| 2015/0243683 A1* | 8/2015 | Lee | H01L 29/7869 257/40 |
| 2015/0243685 A1* | 8/2015 | Lee | H01L 29/7869 257/43 |
| 2015/0243689 A1* | 8/2015 | Lee | H01L 27/1225 257/43 |
| 2015/0243724 A1* | 8/2015 | Cho | H01L 29/7869 257/43 |
| 2016/0065191 A1* | 3/2016 | Saito | H01L 27/1251 327/173 |
| 2018/0012947 A1* | 1/2018 | Lee | H01L 27/3272 |
| 2018/0033849 A1* | 2/2018 | Noh | H01L 27/3272 |
| 2018/0219029 A1* | 8/2018 | Hanyu | H01L 27/1248 |
| 2018/0350891 A1* | 12/2018 | Kim | H01L 27/3272 |
| 2018/0357964 A1* | 12/2018 | Shin | G09G 3/3258 |
| 2019/0027511 A1* | 1/2019 | Li | H01L 27/1251 |

FOREIGN PATENT DOCUMENTS

| | | |
|---|---|---|
| CN | 105097841 | 11/2015 |
| CN | 105765709 | 7/2016 |
| CN | 106449521 | 2/2017 |

* cited by examiner

US 10,559,696 B2

HYBRID CMOS DEVICE AND MANUFACTURING METHOD THEREOF

RELATED APPLICATIONS

The present application is a National Phase of International Application Number PCT/CN2017/112969 filed on Nov. 25, 2017, and claims the priority of China Application 201710943188.7, filed on Oct. 11, 2017.

FIELD OF THE DISCLOSURE

The disclosure relates to a display technical field, and more particularly to a Hybrid CMOS device and a manufacturing method thereof.

BACKGROUND

Digital circuits with high performance and low power consumption typically require transistors adopting complementary metal-oxide-semiconductor (CMOS) structures. A representative of metal oxide semiconductors is indium gallium zinc oxide (IGZO). However, due to a large number of defect states exist in a top of the valence band of IGZO, these defects may exhaust holes, such that IGZO is only expressed as N-type unipolar semiconductor, and the lack of P-type semiconductor makes a design of a logic circuit based on facing difficulties.

Currently, the design of the logic circuit related to the IGZO TFT may be roughly divided into two types.

A first type is using a Pseudo-CMOS transistor composed of an IGZO TFT to implement a NOT gate (inverter). In the Pseudo-CMOS design, because a load transistor and a driving transistor have voltages with different thresholds, IGZO TFT with depletion mode and enhancement mode are prepared on the same sample at the same time. Therefore, the introduction of dual-gate structure or dual-layer active layer structure and extra illumination of the load transistor are developed and applied to the process of the Pseudo-CMOS transistors consisting of the IGZO TFT. However, even if these processes are adopted to improve the inverter, it fails to solve the problem of high static power consumption and small noise margin of the pseudo-CMOS.

A second type is using of a hybrid CMOS transistor to achieve a NOT gate (inverter). That is, a P-type load transistor (PMOS transistor) may be achieved using other semiconductor materials. In the past design of hybrid CMOS transistors, the semiconductor material used by the P-type load transistor is either a two-dimensional carbon nanotube (CNT) material or an organic semiconductor material. However, in the producing process of the CNT material, some of the materials are always be metalized, organic semiconductor TFT has low mobility, poor stability and is sensitive to water and oxygen in the environment. Therefore, a scheme for a large-scale preparation of a hybrid CMOS transistor remains to be studied.

SUMMARY

An object of the disclosure is to provide a manufacturing method of a hybrid CMOS device. Compared with the existing method for producing an active layer of the PMOS transistor by using a two-dimensional carbon nanotube material or an organic semiconductor material, the hybrid CMOS device obtained according to the disclosure has superior electrical properties and better ductility, so as to make flexible electronic circuits possible.

Another object of the disclosure is to provide a hybrid CMOS device. Compared with the existing hybrid CMOS device, the hybrid CMOS device obtained according to the disclosure has superior electrical properties and better ductility, so as to make flexible electronic circuits possible.

To achieve the above objects, the disclosure provides a manufacturing method of a hybrid CMOS device, including the following steps:

step S1: providing a substrate, forming a buffer layer on the substrate, forming a first active layer on the buffer layer, the material of the first active layer including a low-temperature polysilicon;

forming a first gate insulating layer covering the first active layer on the buffer layer;

forming a first gate corresponding to a top of the first active layer and a second gate arranged spaced apart from the first gate on the first gate insulating layer;

step S2: performing a P-type heavy doping on two ends of the first active layer by using the first gate as a barrier layer, respectively forming a source contact region and a drain contact region on the two ends of the first active layer to obtain a sample to be hydrogenated;

step S3: performing a plasma treatment on the sample to be hydrogenated by using a hydrogen plasma to hydrogenate the first active layer;

step S4: forming a second gate insulating layer covering the first gate and the second gate on the first gate insulating layer;

forming a second active layer corresponding to a top of the second gate on the second gate insulating layer, a material of the second active layer including a metal oxide semiconductor;

step S5: forming an etched barrier layer on the second active layer, and forming a first via corresponding to a top of the source contact region of the first active layer on the first gate insulating layer and the second gate insulating layer, and forming a second via corresponding to a top of the drain contact region of the first active layer;

step S6: forming a first source on the second gate insulating layer and a source-drain common structural layer and a second drain on the etched barrier layer, the second active layer and the second gate insulating layer;

the first source contacted with the source contact region of the first active layer via the first via; one end of the source-drain common structural layer contacted with the drain contact region of the first active layer via the second via, and the other end directly contacted with one end of the second active layer; the second drain directly contacted with the other end of the second active layer; a hybrid CMOS device being manufactured.

step S7: performing an annealing treatment on the hybrid CMOS device;

step S8: performing a rapid thermal annealing treatment on the hybrid CMOS device to remove hydrogen in the second active layer.

In the step S1, the manufacturing method of the first active layer is: depositing an amorphous silicon membrane on the buffer layer, performing a laser annealing treatment on the amorphous silicon membrane to crystallize the amorphous silicon membrane into a low-temperature polycrystalline silicon thin film, etching the low-temperature polycrystalline silicon thin film to obtain the first active layer.

In the step S4, the manufacturing method of the second active layer is: depositing a metal oxide semiconductor thin film on the second gate insulating layer, etching the metal oxide semiconductor thin film to obtain the second active layer.

In the step S2, a P-type heavy doping is performed on the two ends of the first active layer by an ion implantation; and a P-type ion used by the P-type heavy doping is a boron ion.

In the step S5, an etched barrier thin film is formed on the second active layer and the second gate insulating layer; the etched barrier layer is formed by performing a graphic processing on the etched barrier thin film using a lithography process; and a first via and the second via are formed by performing a graphic processing on the first gate insulating layer and the second gate insulating layer using the same lithography process.

In the hybrid CMOS device, the first active layer, the first gate, the first source, and the source-drain common structural layer jointly form a PMOS transistor, and the second active layer, the second gate, the source-drain common structural layer, and the second drain jointly form an NMOS transistor; in the PMOS transistor, the source-drain common structural layer functions as a drain; in the NMOS transistor, the source-drain common structural layer functions as a source.

In the step S7, the annealing treatment is performed in a nitrogen environment, a temperature of the annealing treatment is 300° C. to 400° C., and a period for the annealing treatment is one hour to three hours.

In the step S8, the rapid thermal annealing treatment is performed in a nitrogen environment, a temperature of the rapid thermal annealing treatment is 500° C. to 520° C., and a period for the rapid thermal annealing treatment is one minute to five minutes.

The disclosure also provides a hybrid CMOS device, including: a substrate, a buffer layer arranged on the substrate, a first active layer arranged on the buffer layer, a first gate insulating layer arranged on the buffer layer and covering the first active layer, a first gate arranged on the first gate insulating layer and corresponding to a top of the first active layer, a second gate arranged spaced apart from the first gate, a second gate insulating layer arranged on the first gate insulating layer and covering the first gate and the second gate, a second active layer arranged on the second gate insulating layer and corresponding to a top of the second gate, an etched barrier layer arranged on the second active layer, a first source arranged on the second gate insulating layer, a source-drain common structural layer and a second drain arranged on the etched barrier layer, the second active layer and the second gate insulating layer;

a material of the second active layer including a metal oxide semiconductor; the material of the first active layer including a low-temperature polysilicon; two ends of the first active layer respectively provided with a source contact region and a drain contact region, the source contact region and the drain contact region being P-type heavily doped regions;

the first gate insulating layer and the second gate insulating layer provided with a first via corresponding to a top of the source contact region of the first active layer and a second via corresponding to a top of the drain contact region of the first active layer;

the first source contacted with the source contact region of the first active layer through the first via; one end of the source-drain common structural layer contacted with the drain contact region of the first active layer through the second via, and the other end of the source-drain common structural layer directly contacted with one end of the second active layer; the second drain directly contacted with the other end of the second active layer.

The P-type ion in the source contact region and the drain contact region is a boron ion; and the metal oxide semiconductor is indium gallium zinc oxide.

In the hybrid CMOS device, the first active layer, the first gate, the first source, and the source-drain common structural layer jointly form a PMOS transistor, and the second active layer, the second gate, the source-drain common structural layer, and the second drain jointly form an NMOS transistor; in the PMOS transistor, the source-drain common structural layer functions as a drain; in the NMOS transistor, the source-drain common structural layer functions as a source.

The disclosure also provides a manufacturing method of a hybrid CMOS device, including the following steps:

step S1: providing a substrate, forming a buffer layer on the substrate, forming a first active layer on the buffer layer, the material of the first active layer including a low-temperature polysilicon;

forming a first gate insulating layer covering the first active layer on the buffer layer;

forming a first gate corresponding to a top of the first active layer and a second gate arranged spaced apart from the first gate on the first gate insulating layer;

step S2: performing a P-type heavy doping on two ends of the first active layer by using the first gate as a barrier layer, respectively forming a source contact region and a drain contact region on the two ends of the first active layer to obtain a sample to be hydrogenated;

step S3: performing a plasma treatment on the sample to be hydrogenated by using a hydrogen plasma to hydrogenate the first active layer;

step S4: forming a second gate insulating layer covering the first gate and the second gate on the first gate insulating layer;

forming a second active layer corresponding to a top of the second gate on the second gate insulating layer, a material of the second active layer including a metal oxide semiconductor;

step S5: forming an etched barrier layer on the second active layer, and forming a first via corresponding to a top of the source contact region of the first active layer on the first gate insulating layer and the second gate insulating layer, and forming a second via corresponding to a top of the drain contact region of the first active layer;

step S6: forming a first source on the second gate insulating layer and a source-drain common structural layer and a second drain on the etched barrier layer, the second active layer and the second gate insulating layer;

the first source contacted with the source contact region of the first active layer via the first via; one end of the source-drain common structural layer contacted with the drain contact region of the first active layer via the second via, and the other end directly contacted with one end of the second active layer; the second drain directly contacted with the other end of the second active layer; a hybrid CMOS device being manufactured;

step S7: performing an annealing treatment on the hybrid CMOS device;

step S8: performing a rapid thermal annealing treatment on the hybrid CMOS device to remove hydrogen in the second active layer;

wherein in the step S1 the manufacturing method of the first active layer is: depositing an amorphous silicon membrane on the buffer layer, performing a laser annealing treatment on the amorphous silicon membrane to crystallize the amorphous silicon membrane into a low-temperature polycrystalline silicon thin film, etching the low-temperature polycrystalline silicon thin film to obtain the first active layer;

In the step S4, the manufacturing method of the second active layer is: depositing a metal oxide semiconductor thin film on the second gate insulating layer, etching the metal oxide semiconductor thin film to obtain the second active layer;

wherein in the step S2, a P-type heavy doping is performed on both ends of the first active layer by an ion implantation; and a P-type ion used by the P-type heavy doping is a boron ions;

wherein in the step S5, the etched barrier thin film is formed on the second active layer and the second gate insulating layer; the etched barrier layer is formed by performing a graphic processing on the etched barrier membrane using a lithography process; and the first via and the second via are formed by performing a graphic processing on the first gate insulating layer and the second gate insulating layer using the same lithography process;

wherein in the hybrid CMOS device, the first active layer, the first gate, the first source, and the source-drain common structural layer jointly form a PMOS transistor, and the second active layer, the second gate, the source-drain common structural layer, and the second drain jointly form an NMOS transistor; in the PMOS transistor, the source-drain common structural layer functions as a drain; in the NMOS transistor, the source-drain common structural layer functions as a source.

The advantageous effects of the disclosure are as follows. The manufacturing method of the hybrid CMOS device according to the disclosure uses the low-temperature polysilicon to prepare the active layer of the PMOS transistor, and simultaneously uses the metal oxide semiconductor to prepare the active layer of the NMOS transistor. The two types of semiconductor materials are mixedly used to form the hybrid CMOS device. Compared with the existing method for producing the active layer of the PMOS transistor by using a two-dimensional carbon nanotransister material or an organic semiconductor material, the hybrid CMOS device obtained according to the disclosure has superior electrical properties. In the manufacturing process, the first active layer is hydrogenated to improve the electrical properties of the first active layer and the rapid thermal annealing method is used in a subsequent process to remove the hydrogen contamination in the second active layer, so as to ensure that the second active layer has good electrical properties. Compared with a CMOS device only using a silicon-based semiconductor material, the hybrid CMOS device obtained according to the disclosure has better ductility and makes flexible electronic circuits possible. Compared with a manufacturing method of a CMOS device only using a low-temperature polysilicon material, the manufacturing method of the hybrid CMOS device according to the disclosure, the process is simpler and easier to perform. Compared with the existing hybrid CMOS device, the hybrid CMOS device manufactured by the above method according to the disclosure, has superior electrical properties and better ductility and makes flexible electronic circuits possible.

In order to further understand the characteristics and the technical contents of the disclosure, please refer to the detailed description and the figures. However, the figures are provides for reference and illustration only and are not intended to limit the disclosure.

BRIEF DESCRIPTION OF THE DRAWINGS

The technical schemes of the disclosure and the beneficial effects will be apparent through the detailed illustration to the specific embodiments of the disclosure in conjunction with the figures.

In the figures.

DETAILED DESCRIPTION OF PREFERRED EMBODIMENTS

To further illustrate the technical means adopted by the disclosure and the technical effects thereof, a further detailed description will be made in conjunction with the preferred embodiments and the accompanying drawings of the disclosure.

Figure 1:
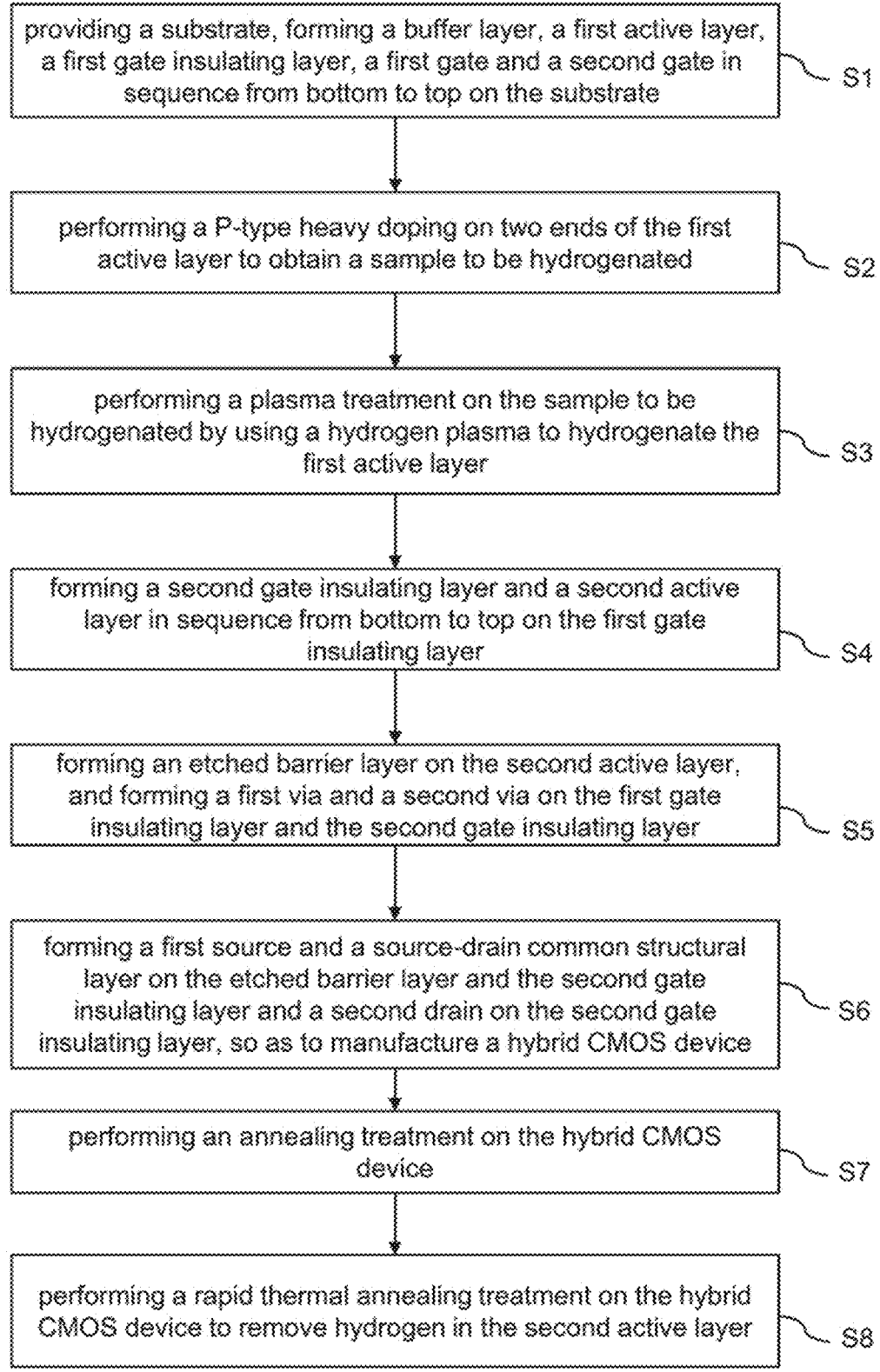
FIG. 1 is a flow chart of a manufacturing method of a hybrid CMOS device of the disclosure.

Please refer to FIG. 1, the disclosure provides a manufacturing method of a hybrid CMOS device, including the following steps.

Figure 2:
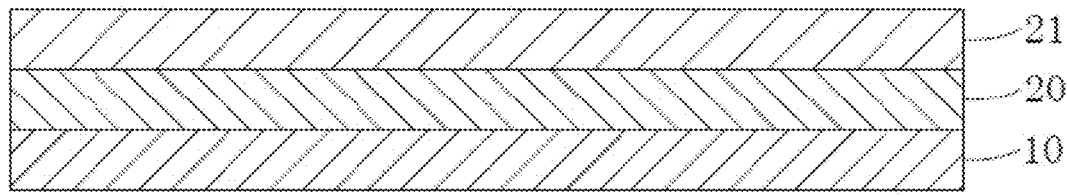
FIGS. 2 to 5 are schematic views of step S1 of the manufacturing method of the hybrid CMOS device of the disclosure.
Figure 3:
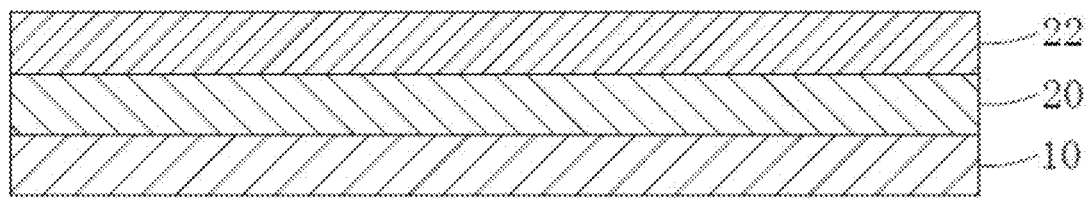
Figure 4:
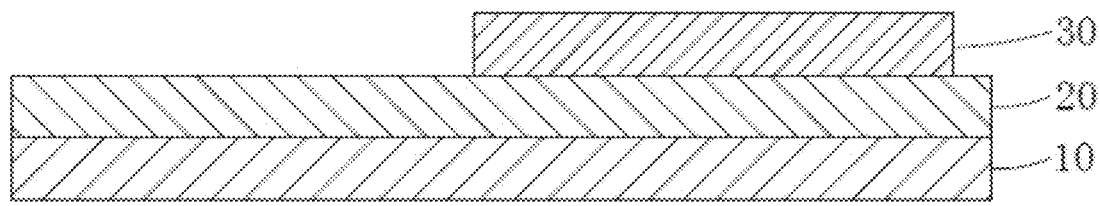

In step S1, as shown in FIGS. 2 to 4, a substrate 10 is provided, a buffer layer 20 is formed on the substrate 10, a first active layer 30 is formed on the buffer layer 20, and a material of the first active layer 30 includes low-temperature polysilicon.

Figure 5:
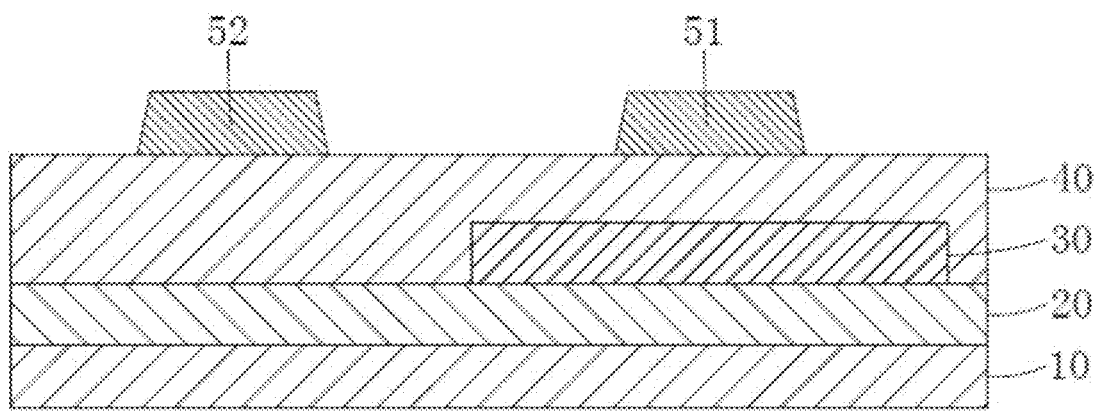

As shown in FIG. 5, a first gate insulating layer 40 covering the first active layer 30 is formed on the buffer layer 20.

A first gate 51 corresponding to a top of the first active layer 30 and a second gate 52 spaced apart from the first gate 51 are formed on the first gate insulating layer 40.

Specifically, as shown in FIGS. 2 to 4, in the step S1, the manufacturing method of the first active layer 30 is: depositing an amorphous silicon membrane 21 on the buffer layer 20, performing a laser annealing treatment on the amorphous silicon membrane 21 to crystallize the amorphous silicon membrane 21 into a low-temperature polysilicon thin film 22, etching the low-temperature polysilicon thin film 22 to obtain the first active layer 30.

Specifically, the buffer layer 20 has a thickness of 300 nm.

Specifically, the substrate 10 is a glass substrate.

Figure 6:
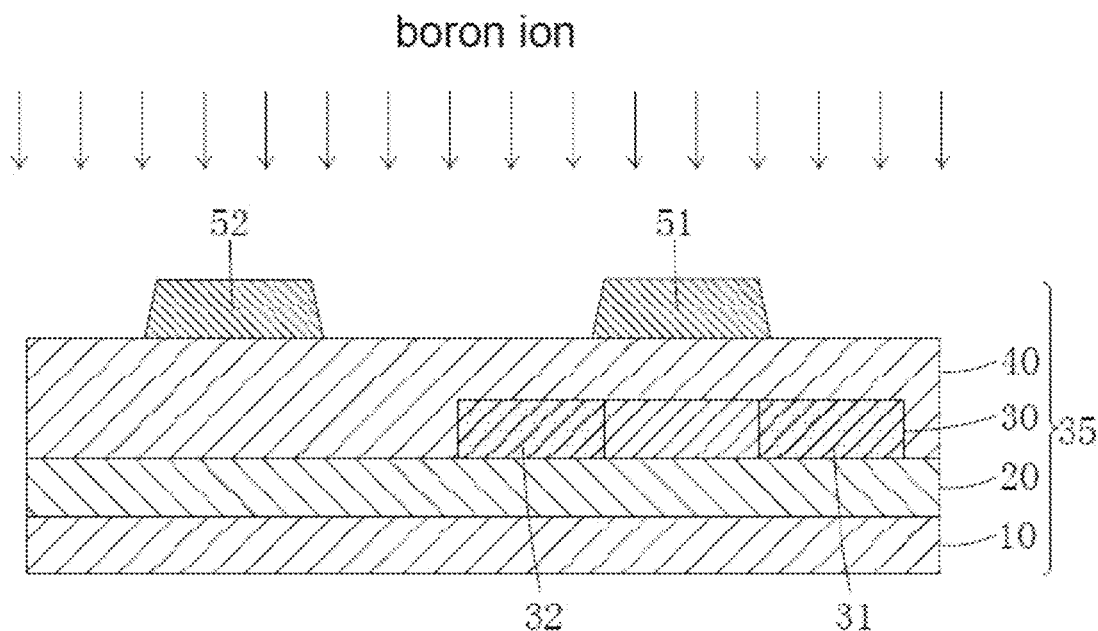
FIG. 6 is a schematic view of step S2 of the manufacturing method of the hybrid CMOS device of the disclosure.

In step S2, as shown in FIG. 6, a P-type heavy doping is performed on two ends of the first active layer 30 by using the first gate 51 as a barrier layer. The source contact region 31 and the drain contact region 32 are respectively formed on the two ends of the first active layer 30 to obtain a sample 35 to be hydrogenated.

Specifically, in step S2, the P-type heavy doping is performed on the two ends of the first active layer 30 by an ion implantation.

Preferably, a P-type ion with the P-type heavy doping is a boron ion ($B^+$).

Specifically, a concentration of the P-type ion in the source contact region 31 and the drain contact region 32 is $1*10^{14}$ ions/cm$^3$ to $8*10^{15}$ ions/cm$^3$.

Figure 7:
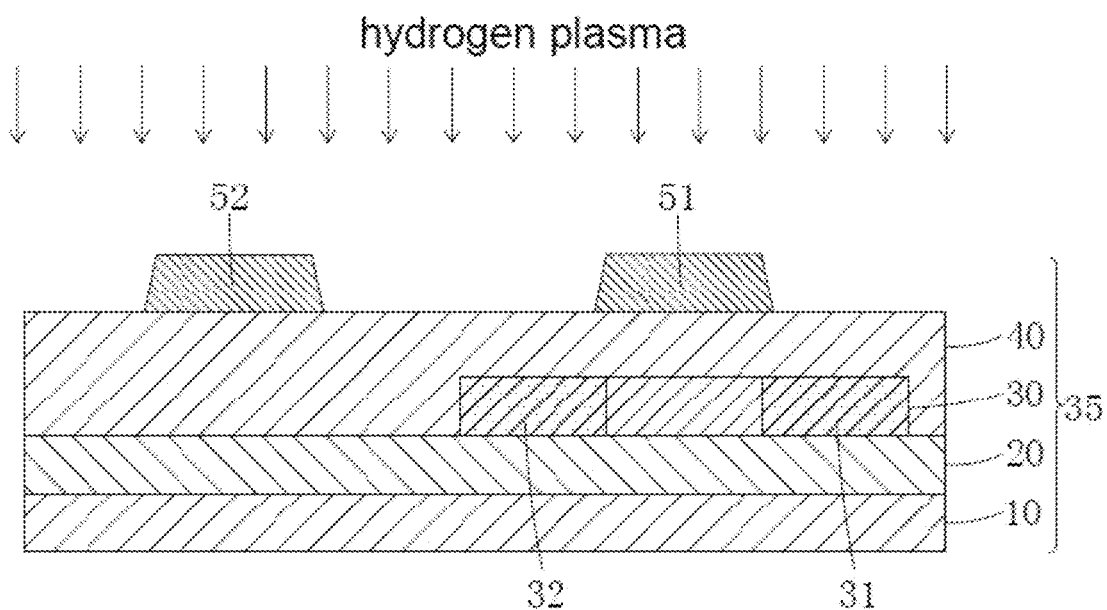
FIG. 7 is a schematic view of step S3 of the manufacturing method of the hybrid CMOS device of the disclosure.

In step S3, as shown in FIG. 7, a plasma treatment is performed on the sample 35 to be hydrogenated by the hydrogen plasma to hydrogenate the first active layer 30, thereby improving the electrical property of the first active layer 30.

Specifically, the step S3 is performed in a chamber of plasma enhanced chemical vapor deposition (PECVD).

Figure 8:
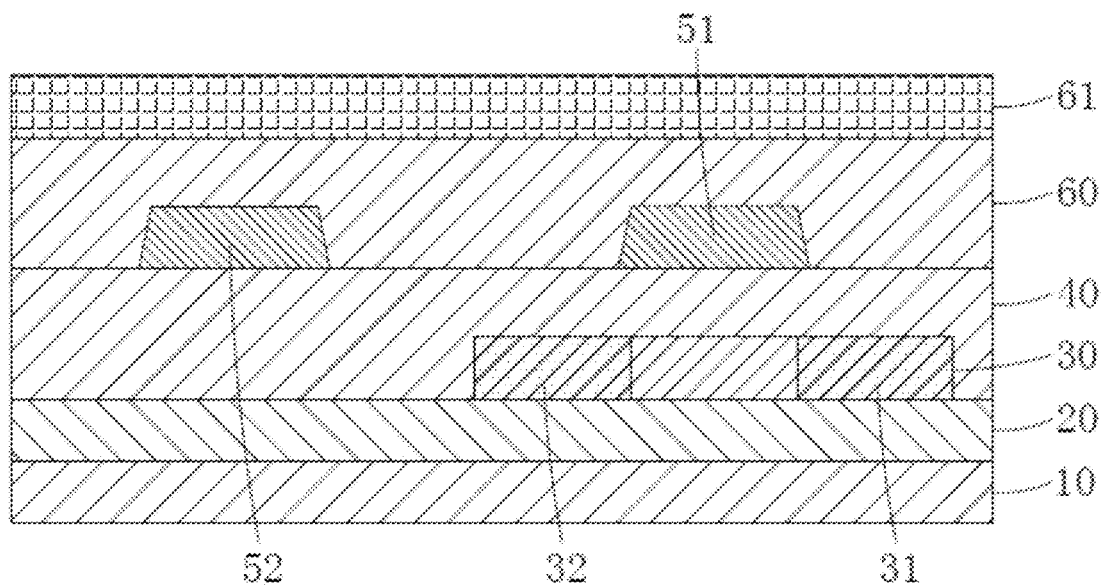
FIGS. 8 to 9 are schematic views of step S4 of the manufacturing method of the hybrid CMOS device of the disclosure.
Figure 9:
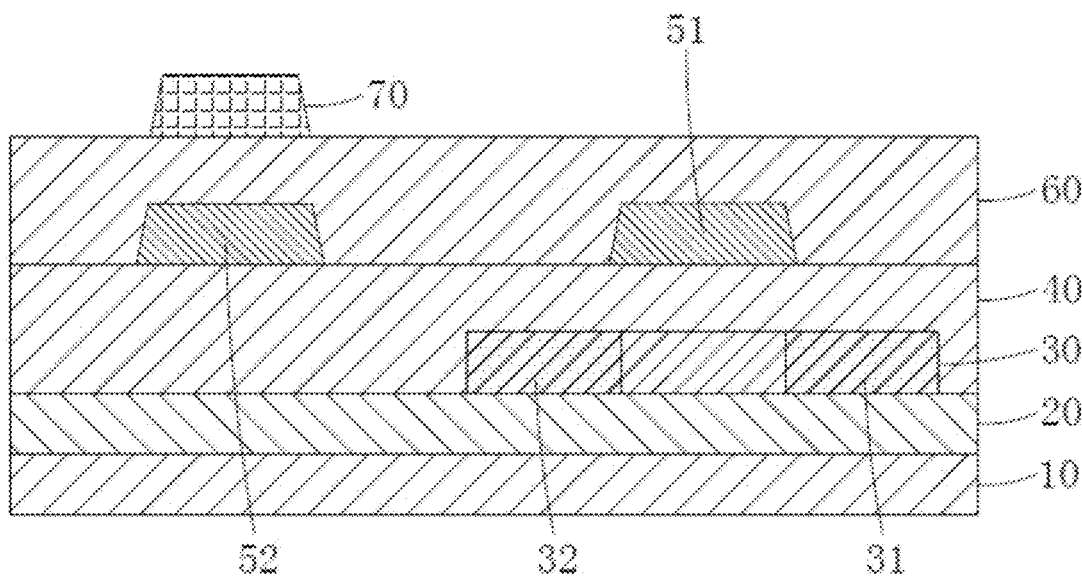

In step S4, as shown in FIGS. 8 to 9, a second gate insulating layer 60 covering the first gate 51 and the second gate 52 is formed on the first gate insulating layer 40.

A second active layer 70 corresponding to the second gate 52 is formed on the second gate insulating layer 60. The material of the second active layer 70 includes a metal oxide semiconductor.

Specifically, as shown in FIGS. 8 to 9, in the step S4, the manufacturing method of the second active layer 70 is: depositing a metal oxide semiconductor membrane 61 on the second gate insulating layer 60, etching the metal oxide semiconductor membrane 61 to obtain the second active layer 70.

Preferably, the metal oxide semiconductor is indium gallium zinc oxide (IGZO).

Preferably, a material of the first gate insulating layer 40 and the second gate insulating layer 60 is silicon oxide ($SiO_x$).

Specifically, total thicknesses of the first gate insulating layer 40 and the second gate insulating layer 60 are 400 nm. Preferably, the thicknesses of the first gate insulating layer 40 and the second gate insulating layer 60 are 200 nm.

Figure 10:
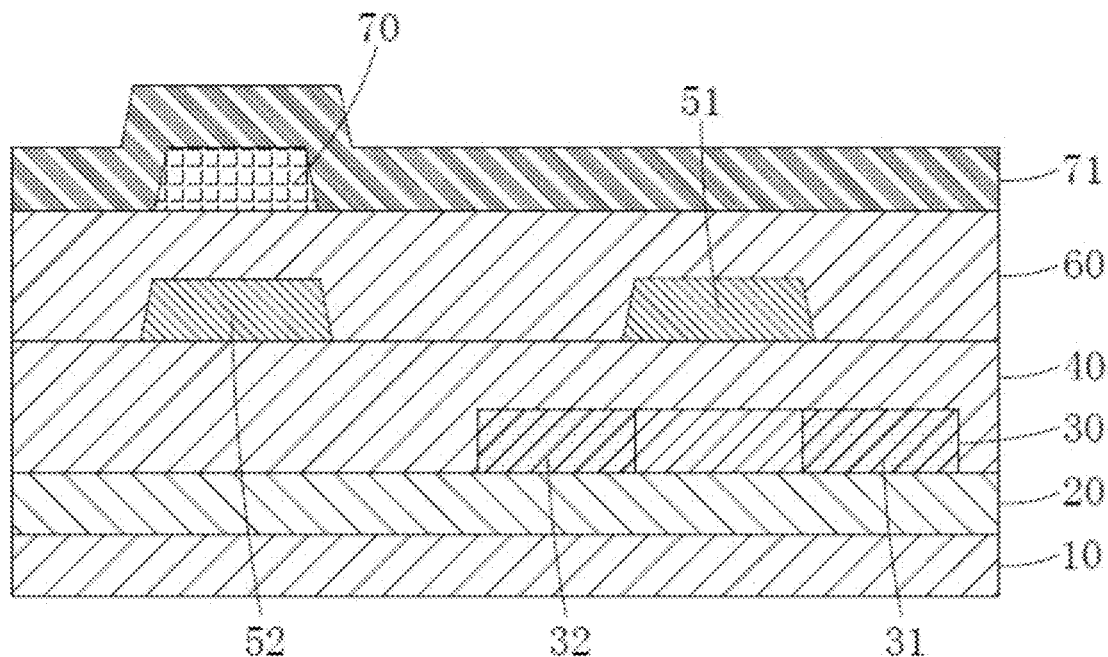
FIGS. 10 to 11 are schematic views of step S5 of the manufacturing method of the hybrid CMOS device of the disclosure.
Figure 11:
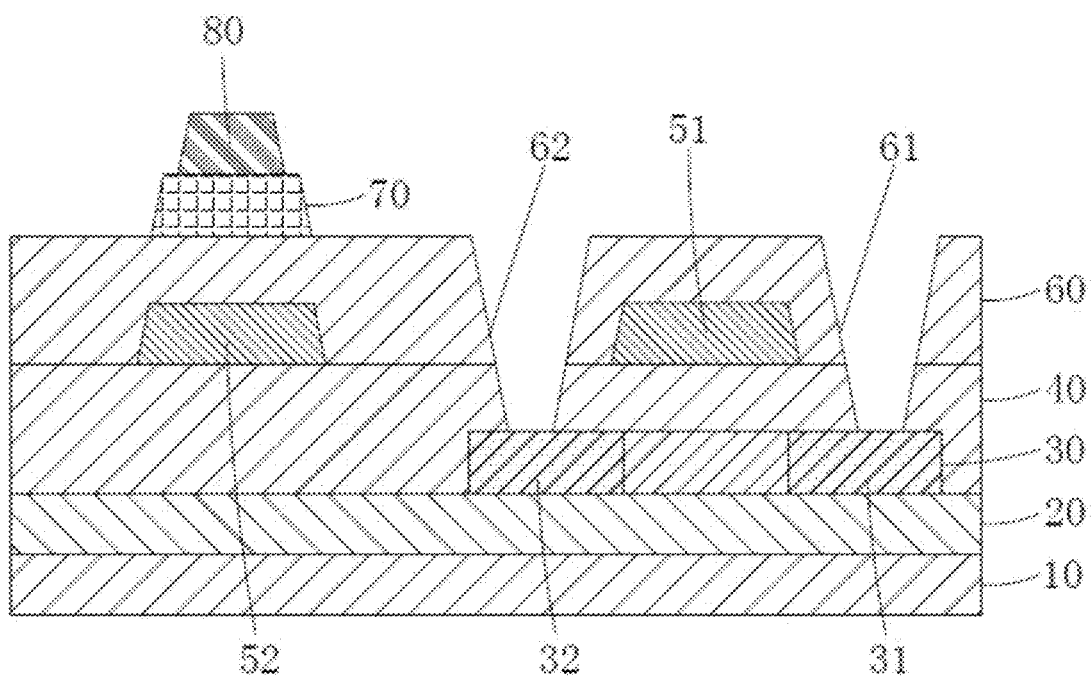

In step S5, as shown in FIGS. 10 to 11, an etched barrier layer 80 is formed on the second active layer 70, a first via 61 corresponding to a top of the source contact region 31 of the first active layer 30 and a second via 62 corresponding to a top of the drain contact region 32 of the first active layer 30 are formed on the first gate insulating layer 40 and the second gate insulating layer 60.

Specifically, as shown in FIGS. 10 to 11, the step S5 includes: forming an etched barrier thin film 71 on the second active layer 70; forming an etched barrier layer 80 by performing a graphic processing on the etched barrier thin film 71 using a lithography process; and forming the first via 61 and the second via by performing a graphic processing on the first gate insulating layer 40 and the second gate insulating layer 60 using the same lithography process.

Specifically, a thickness of the etched barrier layer 80 is 100 nm.

Figure 12:
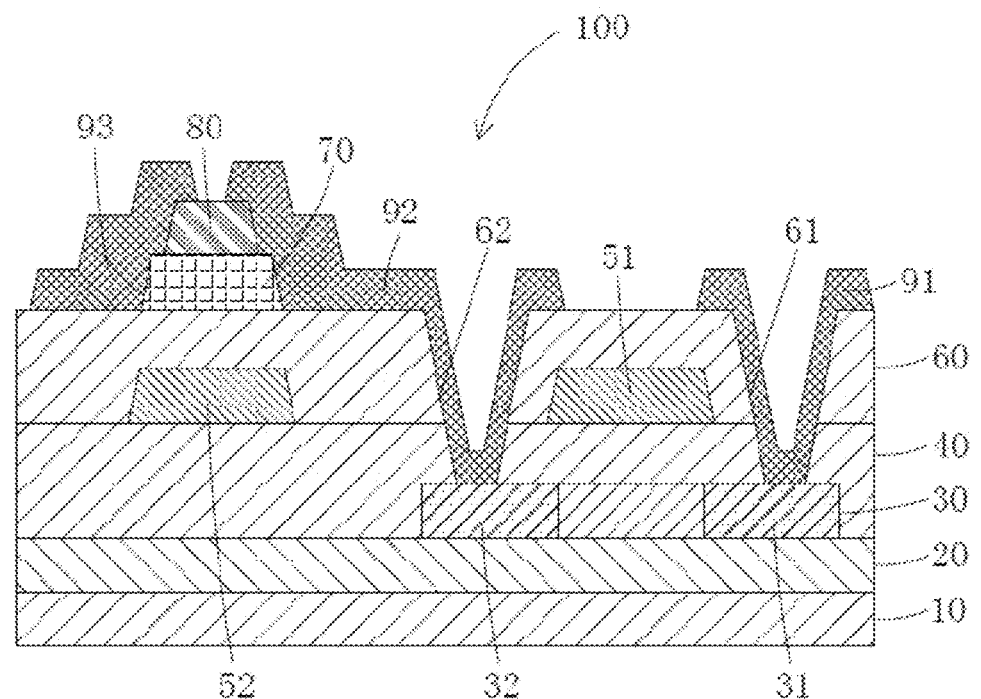
FIG. 12 is a schematic view of step S6 of the manufacturing method of the hybrid CMOS device of the disclosure and a basic structural schematic view of the hybrid CMOS device of the disclosure.

In step S6, as shown in FIG. 12, a first source 91 is formed on the second gate insulating layer 60 and a source-drain common structural layer 92 and a second drain 93 are formed on the etched barrier layer 80, the second active layer 70 and the second gate insulating layer.

The first source 91 is contacted with the source contact region 31 of the first active layer 30 via the first via 61. One end of the source-drain common structural layer 92 is contacted with the drain contact region 32 of the first active layer 30 via the second via 62, and the other end is directly contacted with one end of the second active layer 70. The second drain 93 is directly contacted with the other end of the second active layer 70.

The hybrid CMOS device 100 is manufactured.

Specifically, in the step S6, the manufacturing method of the first source 91, the source-drain common structural layer 92, and the second drain 93 is: depositing a source-drain metal thin film (not shown) on the second gate insulating layer 60, the etched barrier layer 80 and the second active layer 70; and etching the source-drain metal thin film to obtain the first source 91, the source-drain common structural layer 92 and the second drain 93.

Specifically, in the hybrid CMOS device 100, the first active layer 30, the first gate 51, the first source 91, and the source-drain common structural layer 92 jointly form a PMOS transistor, and the second active layer 70, the second gate 52, the source-drain common structural layer 92, and the second drain 93 jointly form an NMOS transistor. In the PMOS transistor, the source-drain common structural layer 92 functions as a drain. In the NMOS transistor, the source-drain common structural layer 92 functions as a source.

By sharing the source and drain of the NMOS transistor and the PMOS transistor, it is advantageous to realize an inverter function of the hybrid CMOS device 100.

Specifically, when the hybrid CMOS device 100 is used in a logic circuit to implement the inverter function, the NMOS transistor is a driving transistor and the PMOS transistor is a load transistor.

In step S7, the hybrid CMOS device 100 is annealed to improve the electrical property of the second active layer 70 made of the metal oxide semiconductor material.

Specifically, in the step S7, the annealing is performed in a nitrogen ($N_2$) environment, the annealing is performed at a temperature of 300° C. to 400° C., and the annealing is performed for a period of one hour to three hours.

Preferably, in the step S7, the annealing is performed at the temperature of 350°, and the annealing is performed for the period of one hour.

Figure 13:
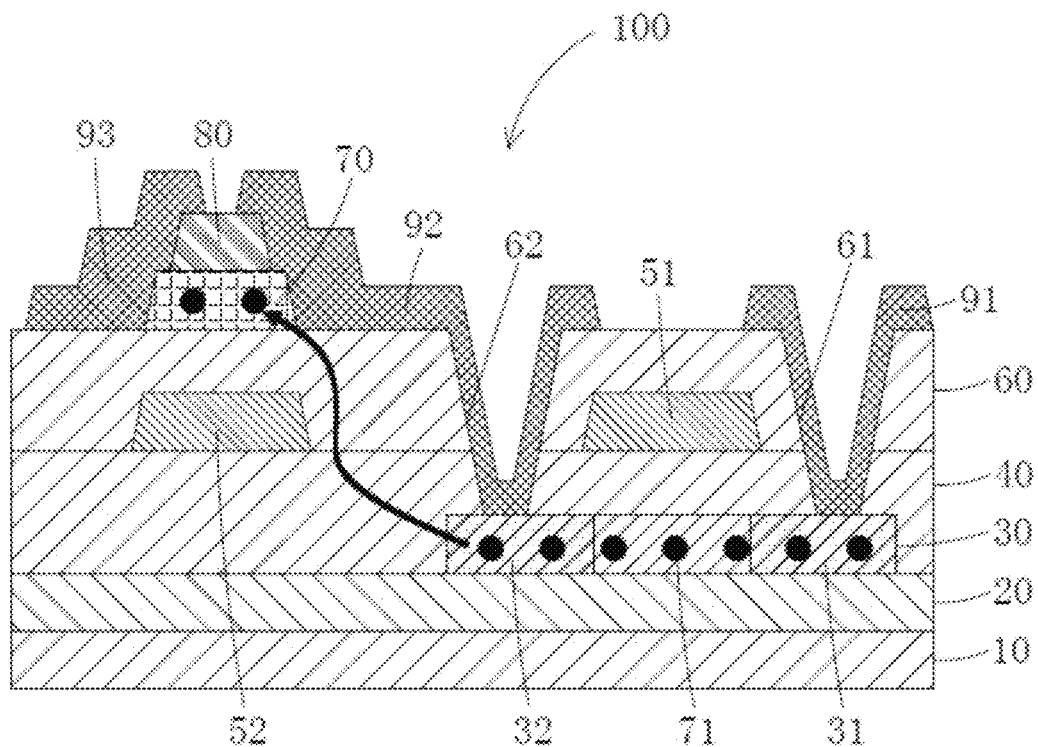
FIG. 13 is a schematic view of Hydrogen diffusion in step S7 of the manufacturing method of the hybrid CMOS device of the disclosure.

As shown in FIG. 13, during the annealing treatment in the step S7, the hydrogen element 71 in the first active layer 30 previously hydrogenated (in the step S3) passes through the first gate insulating layer 40 and the second gate insulating layer 60 under a high temperature condition to diffuse into the second active layer 70, so as to cause hydrogen contamination to the metal oxide semiconductor material in the second active layer 70. After testing the NMOS transistor annealed in step S6, it is found that a switch ratio thereof is very low and the current is almost not adjusted and controlled by a gate voltage. Therefore, it is necessary to perform the dehydrogenation treatment on the second active layer 70 in a subsequent step S7 to improve the performance of the second active layer 70 to improve the electrical properties of NMOS transistors.

Preferably, the annealing treatment in the step S7 is performed in a tube furnace.

In step S8, the hybrid CMOS device 100 is subjected to a rapid thermal annealing (RTA) treatment to remove the hydrogen element 71 in the second active layer 70.

Preferably, in the step S8, the rapid thermal annealing treatment is performed in a nitrogen environment, a temperature of the rapid thermal annealing treatment is 500° C. to 520° C., and a period for the rapid thermal annealing treatment is one minute to five minutes. Preferably, the temperature of the rapid thermal annealing is 510° C., and the period of the rapid thermal annealing is three minutes.

Figure 14:
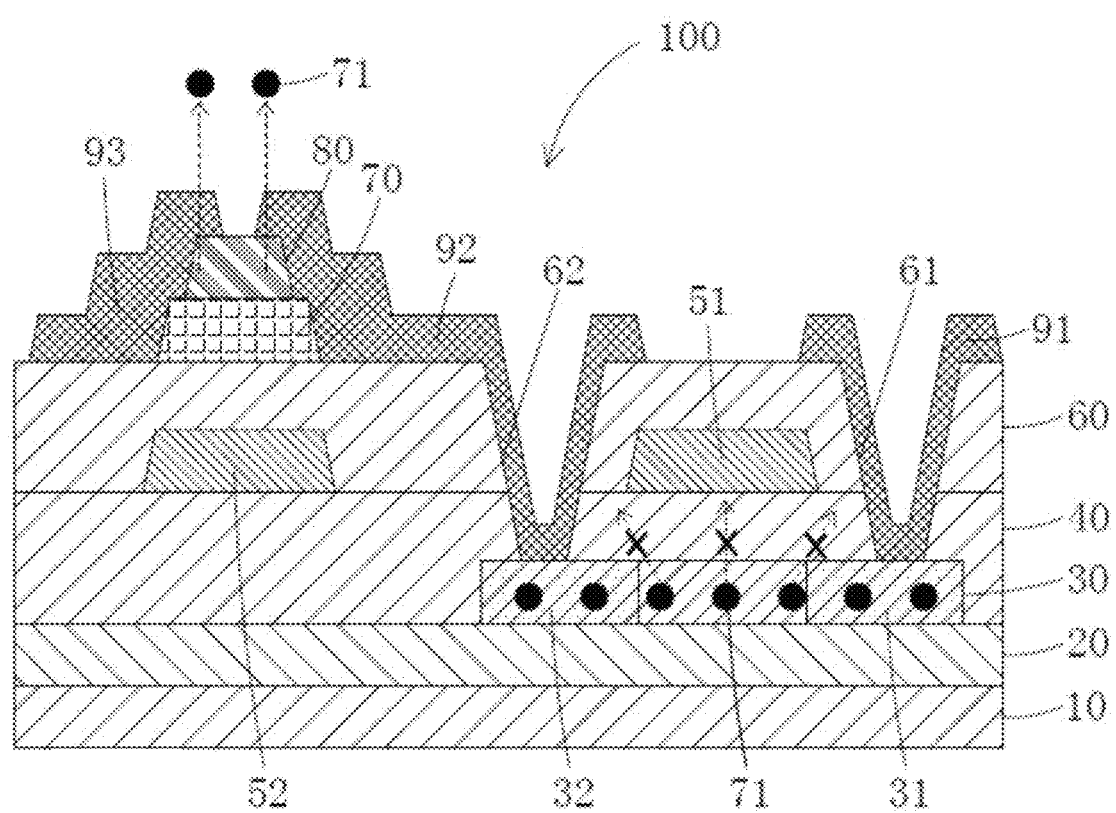
FIG. 14 is a schematic view of hydrogen contamination in the active layer removed in step S8 of the manufacturing method the hybrid CMOS device of the disclosure.
Figure 15:
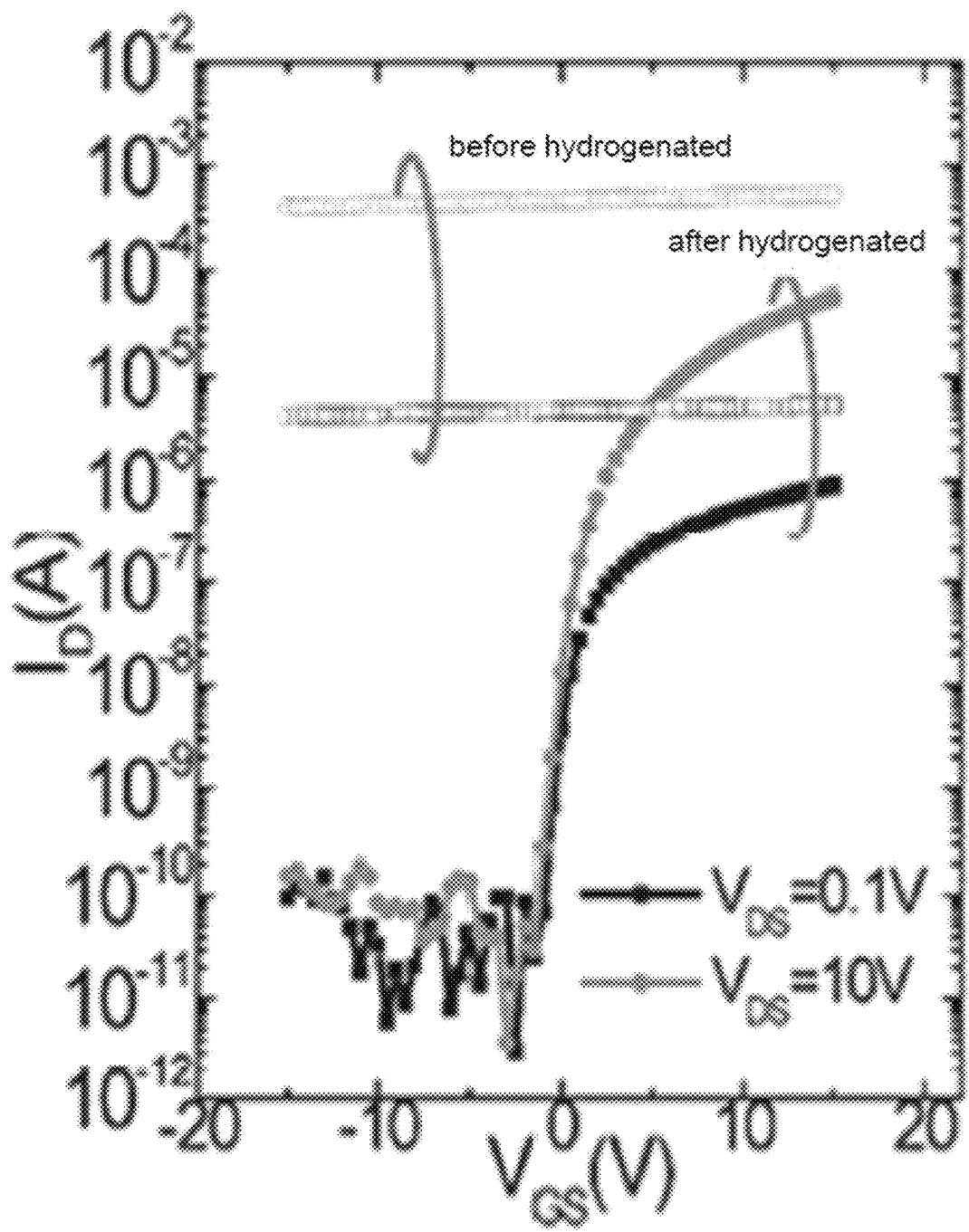
FIG. 15 is a transit characteristic curve of NMOS transistors before and after dehydrogenation.
Figure 16:
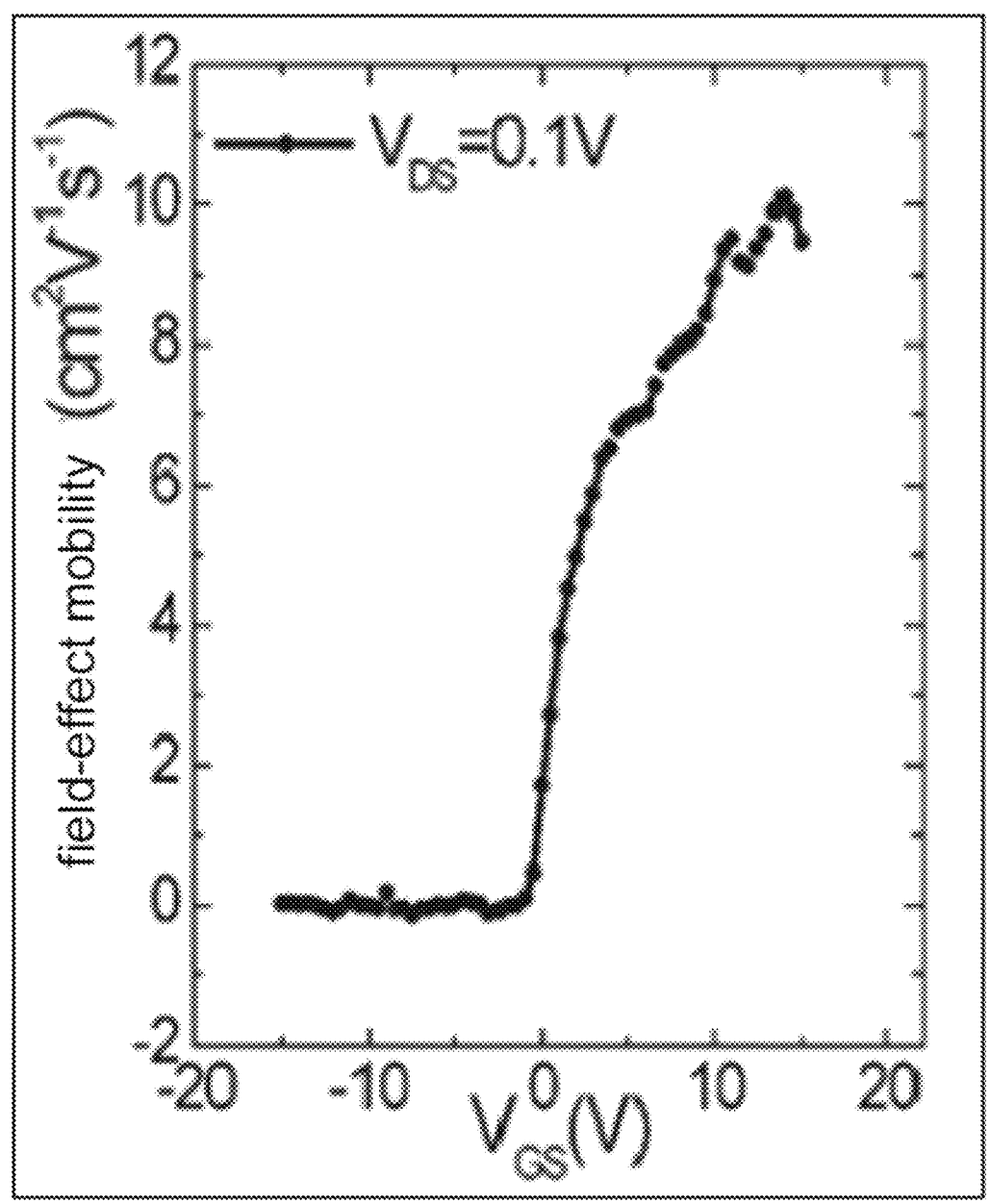
FIG. 16 is the field effect mobility curve of the NMOS transistor after dehydrogenation.

As shown in FIG. 14, in the step S8, the hydrogen contamination in the second active layer 70 is directionally removed by the rapid thermal annealing method. Under the high temperature of 510° C., hydrogen bonds are more easily broken and the diffusion may be more violent, and the annealing time is controlled to three minutes. At this time, the hydrogen element 71 in the second active layer 70 may diffuse into the external environment through etched barrier layer 80 with a thickness of 100 nm, and the hydrogen element 71 in the first active layer 30 may not contaminate the second active layer 70 through a thicker first gate insulating layer 40 and a thicker the second gate insulating layer 60 (the sum of the thicknesses is 400 nm). This directional dehydrogenation process may restore the NMOS transistor to a state of high switch ratio. FIG. 15 shows a transit characteristic curve of NMOS transistors before and after dehydrogenation, FIG. 16 shows a field effect mobility curve of the NMOS transistor after dehydrogenation. As shown in FIGS. 15 and 16, after the dehydrogenation process, the switch ratio of the NMOS transistor reaches $10^6$, and the maximum value of the field effect mobility is 10.1 cm$^2$/(V·s) when the $V_{GS}$=14V in a linear work region. As may be seen from FIG. 16, the field effect mobility of the metal oxide semiconductor increases with the gate voltage $V_{GS}$ increasing because of a transport mechanism of the metal oxide semiconductor is a percolation mechanism. That is, the more the number of carriers, the greater the calculated mobility value.

Preferably, the rapid thermal annealing in the step S8 is performed in a tube furnace.

Figure 17:
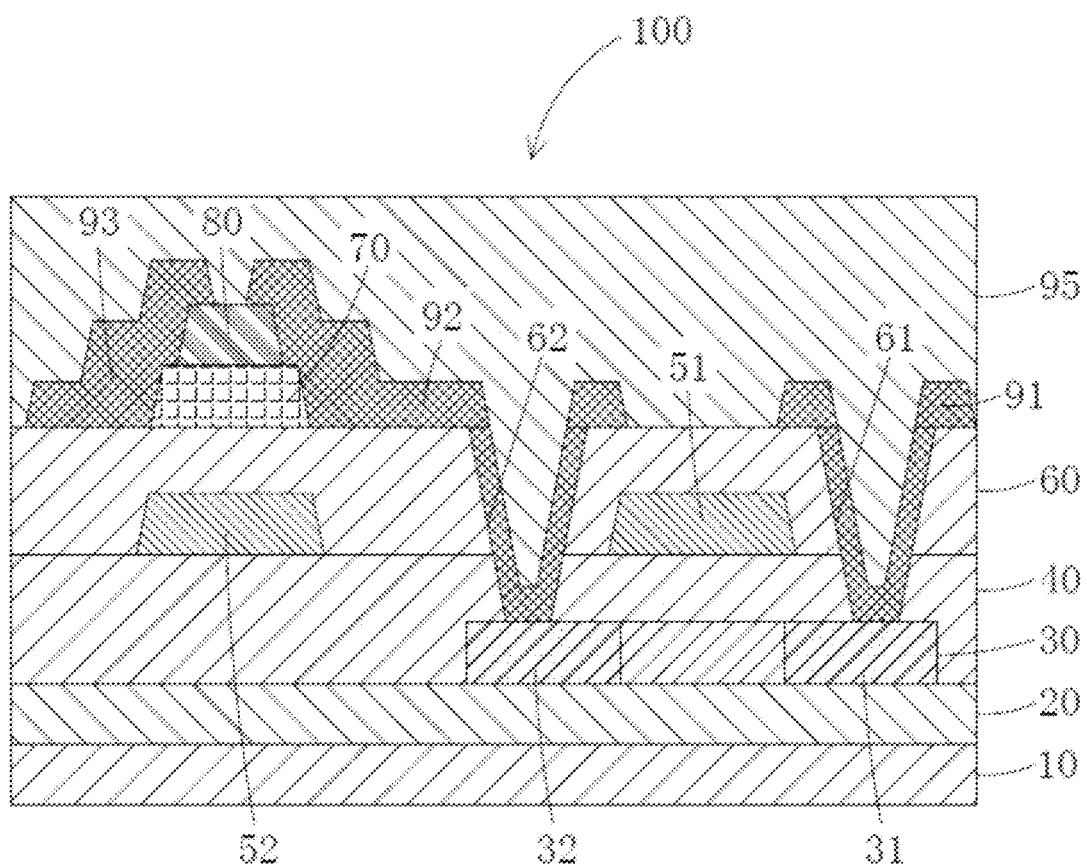
FIG. 17 is a schematic view of step S9 of the manufacturing method of the hybrid CMOS device of the disclosure and a full structural schematic view of the hybrid CMOS device of the disclosure.

Preferably, the manufacturing method of the hybrid CMOS device further includes: in step S9, as shown in FIG. 17, forming, on the etched barrier layer 80 and the second gate insulating layer 60, a passivation layer 95 covering the first source 91, the source-drain common structural layer 92, and the second drain 93.

Specifically, a material of the passivation layer 95 is silicon oxide (SiO$_x$), silicon nitride (SiN$_x$), or a combination thereof.

Preferably, the manufacturing method of the hybrid CMOS device further includes: in step S10, performing a test of electrical properties on the CMOS device 100.

The manufacturing method of the conventional CMOS device only using a low temperature poly-silicon (LTPS) as the semiconductor material requires at least nine photolithographic processes and four doping processes. However, the manufacturing method of the hybrid CMOS device disclosed by the disclosure using low-temperature polysilicon (LTPS) mixed with metal oxide semiconductor (Indium Gallium Zinc Oxide, IGZO) only needs to use five photolithographic processes and one doping process, and the process of the metal oxide semiconductor may be performed simultaneously with the process of the metal oxide semiconductor in the pixel-driven TFT array. Therefore, compared with the manufacturing process of the LTPS CMOS device, the manufacturing process of the hybrid CMOS device of the disclosure is simpler and easier to process.

The manufacturing method of the hybrid CMOS device according to the disclosure uses a low-temperature polysilicon to prepare an active layer of the PMOS transistor, and simultaneously uses the metal oxide semiconductor to prepare the active layer of the NMOS transistor. The two types of semiconductor materials are mixedly used to form the hybrid CMOS device 100. Compared with the existing method for producing the active layer of the PMOS transistor by using a two-dimensional carbon nanotransister material or an organic semiconductor material, the hybrid CMOS device 100 obtained according to the disclosure has superior electrical properties. In the manufacturing process, the first active layer 30 is hydrogenated to improve the electrical properties of the first active layer 30 and the rapid thermal annealing method is used in a subsequent process to remove the hydrogen contamination in the second active layer 70, so as to ensure that the second active layer 70 has good electrical properties. Compared with a CMOS device only using a silicon-based semiconductor material, the hybrid CMOS device 100 obtained according to the disclosure has better ductility and makes flexible electronic circuits possible. Compared with the manufacturing method of a CMOS device only using a low-temperature polysilicon material, the manufacturing method of the hybrid CMOS device according to the disclosure, the process is simpler and easier to perform.

Refer to FIGS. 12 and 17, based on the above manufacturing method of the hybrid CMOS device, the disclosure further provides a hybrid CMOS device 100, including a substrate 10, a buffer layer 20 arranged on the substrate 10, a first active layer 30 arranged on the buffer layer 20, a first gate insulating layer 40 arranged on the buffer layer 20 and covering the first active layer 30, a first gate 51 arranged on the first gate insulating layer 40 and corresponding to a top of the first active layer 30, a second gate 52 arranged spaced apart from the first gate 51, a second gate insulating layer 60 arranged on the first gate insulating layer 40 and covering the first gate 51 and the second gate 52, a second active layer 70 arranged on the second gate insulating layer 60 and corresponding to a top of the second gate 52, an etched barrier layer 80 arranged on the second active layer 70, a first source 91 arranged on the second gate insulating layer 60, a source-drain common structural layer 92 and a second drain 93 arranged on the etched barrier layer 80, the second active layer 70 and the second gate insulating layer 60.

a material of the second active layer 70 including a metal oxide semiconductor, a material of the first active layer 30 including a low-temperature polysilicon. Two ends of the first active layer 30 respectively provided with a source contact region 31 and a drain contact region 32, the source contact region 31 and the drain contact region 32 being P-type heavily doped regions;

the first gate insulating layer 40 and the second gate insulating layer 60 provided with a first via 61 corresponding to a top of the source contact region 31 of the first active layer 30 and a second via 62 corresponding to a top of the drain contact region 32 of the first active layer 30;

the first source 91 contacted with the source contact region 31 of the first active layer 30 through the first via 61, one end of the source-drain common structural layer 92 contacted with the drain contact region 32 of the first active layer 30 through the second via 61, and the other end of the source-drain common structural layer 92 directly contacted with one end of the second active layer 70. The second drain 93 directly contacted with the other end of the second active layer 70.

Preferably, as shown in FIG. 17, the hybrid CMOS device 100 further includes: a passivation layer 95 arranged on the etched barrier layer 80 and the second gate insulating layer 60 and covering the first source 91, the source-drain common structural layer 92 and the second drain 93.

Specifically, a material of the passivation layer 95 is silicon oxide ($SiO_x$), silicon nitride ($SiN_x$), or a combination thereof.

Specifically, the buffer layer 20 has a thickness of 300 nm.

Specifically, the substrate 10 is a glass substrate.

Preferably, the P-type ion in the source contact region 31 and the drain contact region 32 is a boron ion ($B^+$).

Specifically, the concentration of P-type ion in the source contact region 31 and the drain contact region 32 is $1\times10^{14}$ ions/cm$^3$~$8\times10^{15}$ ions/cm$^3$.

Preferably, the metal oxide semiconductor is indium gallium zinc oxide (IGZO).

Preferably, a material of the first gate insulating layer 40 and the second gate insulating layer 60 is silicon oxide ($SiO_x$).

Specifically, the total thicknesses of the first gate insulating layer 40 and the second gate insulating layer 60 is 400 nm. Preferably, the thickness of the first gate insulating layer 40 and the second gate insulating layer 60 is 200 nm.

Specifically, the etched barrier layer 80 has a thickness of 100 nm.

Specifically, in the hybrid CMOS device 100, the first active layer 30, the first gate 51, the first source 91, and the source-drain common structural layer 92 jointly form a PMOS transistor, and the second active layer 70, the second gate 52, the source-drain common structural layer 92, and the second drain 93 jointly form an NMOS transistor. In the PMOS transistor, the source-drain common structural layer 92 functions as a drain. In the NMOS transistor, the source-drain common structural layer 92 functions as a source.

Specifically, when the hybrid CMOS device 100 is used in a logic circuit to achieve an inverter function, the NMOS transistor is a driving transistor and the PMOS transistor is a load transistor.

The hybrid CMOS device according to the disclosure uses the low-temperature polysilicon to prepare the active layer of the PMOS transistor, and simultaneously uses the metal oxide semiconductor to prepare the active layer of the NMOS transistor. The two types of semiconductor materials are mixedly used to form the hybrid CMOS device. Compared with the existing using a two-dimensional carbon nanotransister material or an organic semiconductor material to prepare a hybrid CMOS device of an active layer of a PMOS transistor, the hybrid CMOS device according to the disclosure has superior electrical properties; compared with a CMOS device only using a silicon-based semiconductor material, the hybrid CMOS device according to the disclosure has better ductility, makes flexible electronic circuits possible, and is simpler and easier to process.

In summary, the disclosure provides a hybrid CMOS device and a manufacturing method thereof. The manufacturing method of the hybrid CMOS device according to the disclosure uses the low-temperature polysilicon to prepare the active layer of the PMOS transistor, and mixedly uses the metal oxide semiconductor to prepare the active layer of the NMOS transistor. The two types of semiconductor materials are mixedly used to form the hybrid CMOS device. Comparing with the existing method for producing the active layer of the PMOS transistor by using the two-dimensional carbon nanotransister material or the organic semiconductor material, the hybrid CMOS device obtained according to the disclosure has superior electrical properties. In the producing process, the first active layer is hydrogenated to improve the electrical properties of the first active layer and the rapid thermal annealing method is used in the subsequent process to remove the hydrogen contamination in the second active layer, so as to ensure that the second active layer has good electrical properties. Compared with a CMOS device only using a silicon-based semiconductor material, the hybrid CMOS device obtained according to the disclosure has better ductility and makes flexible electronic circuits possible. Compared with a manufacturing method of a CMOS device only using the low-temperature polysilicon material, the manufacturing method of the hybrid CMOS device according to the disclosure, the process is simpler and easier to perform. Compared with the existing hybrid CMOS device, the hybrid CMOS device manufactured by the above method according to the disclosure, has superior electrical properties and better ductility and makes flexible electronic circuits possible.

For the person skilled in the art of the disclosure, without departing from the concept of the disclosure, simple deductions or substitutions may be made according to the technical solution and technical consideration and should be included in the protection scope of the application.

What is claimed is:

1. A manufacturing method of a hybrid CMOS device, comprising the following steps:

step S1: providing a substrate, forming a buffer layer on the substrate, forming a first active layer on the buffer layer, the material of the first active layer comprising a low-temperature polysilicon;

forming a first gate insulating layer covering the first active layer on the buffer layer;

forming a first gate corresponding to a top of the first active layer and a second gate arranged spaced apart from the first gate on the first gate insulating layer;

step S2: performing a P-type heavy doping on two ends of the first active layer by using the first gate as a barrier layer, respectively forming a source contact region and a drain contact region on the two ends of the first active layer to obtain a sample to be hydrogenated;

step S3: performing a plasma treatment on the sample to be hydrogenated by using a hydrogen plasma to hydrogenate the first active layer;

step S4: forming a second gate insulating layer covering the first gate and the second gate on the first gate insulating layer;

forming a second active layer corresponding to a top of the second gate on the second gate insulating layer, a material of the second active layer comprising a metal oxide semiconductor;

step S5: forming an etched barrier layer on the second active layer, and forming a first via corresponding to a top of the source contact region of the first active layer and a second via corresponding to a top of the drain contact region of the first active layer on the first gate insulating layer and the second gate insulating layer;

step S6: forming a first source on the second gate insulating layer and a source-drain common structural layer and a second drain on the etched barrier layer, the second active layer and the second gate insulating layer;

the first source contacted with the source contact region of the first active layer via the first via; one end of the source-drain common structural layer contacted with the drain contact region of the first active layer via the second via, and the other end is directly contacted with one end of the second active layer; the second drain directly contact with the other end of the second active layer; a hybrid CMOS device being manufactured;

step S7: performing an annealing treatment on the hybrid CMOS device, wherein the annealing treatment is performed in a nitrogen environment, a temperature of the annealing treatment is 300° C. to 400° C., and a period for the annealing treatment is one hour to three hours;

step S8: after performing the annealing treatment, performing a rapid thermal annealing treatment on the hybrid CMOS device to remove hydrogen in the second active layer, wherein the rapid thermal annealing treatment is performed in a nitrogen environment, a temperature of the rapid thermal annealing treatment is 500° C. to 520° C., and a period for the rapid thermal annealing treatment is one minute to five minutes;

wherein in the hybrid CMOS device, the first active layer, the first gate, the first source, and the source-drain common structural layer jointly form a PMOS transistor, and the second active layer, the second gate, the source-drain common structural layer, and the second drain jointly form an NMOS transistor; in the PMOS transistor, the source-drain common structural layer functions as a drain; in the NMOS transistor, the source-drain common structural layer functions as a source.

2. The manufacturing method of the hybrid CMOS device according to claim 1, wherein in the step S1, the manufacturing method of the first active layer is: depositing an amorphous silicon membrane on the buffer layer, performing a laser annealing treatment on the amorphous silicon membrane to crystallize the amorphous silicon membrane into a low-temperature polycrystalline silicon thin film, etching the low-temperature polycrystalline silicon thin film to obtain the first active layer;

in the step S4, the manufacturing method of the second active layer is: depositing a metal oxide semiconductor thin film on the second gate insulating layer, etching the metal oxide semiconductor thin film to obtain the second active layer.

3. The manufacturing method of the hybrid CMOS device according to claim 1, wherein in the step S2, a P-type heavy doping is performed on the two ends of the first active layer by an ion implantation; and a P-type ion used by the P-type heavy doping is a boron ion.

4. The manufacturing method of the hybrid CMOS device according to claim 1, wherein in the step S5, an etched barrier thin film is formed on the second active layer and the second gate insulating layer; the etched barrier layer is formed by performing a graphic processing on the etched barrier thin film using a lithography process; and the first via and the second via are formed by performing a graphic processing on the first gate insulating layer and the second gate insulating layer using the same lithography process.

5. A manufacturing method of a hybrid CMOS device, comprising the following steps:

step S1: providing a substrate, forming a buffer layer on the substrate, forming a first active layer on the buffer layer, the material of the first active layer comprising a low-temperature polysilicon;

forming a first gate insulating layer covering the first active layer on the buffer layer;

forming a first gate corresponding to a top of the first active layer and a second gate arranged spaced apart from the first gate on the first gate insulating layer;

step S2: performing a P-type heavy doping on two ends of the first active layer by using the first gate as a barrier layer, respectively forming a source contact region and a drain contact region on the two ends of the first active layer to obtain a sample to be hydrogenated;

step S3: performing a plasma treatment on the sample to be hydrogenated by using a hydrogen plasma to hydrogenate the first active layer;

step S4: forming a second gate insulating layer covering the first gate and the second gate on the first gate insulating layer;

forming a second active layer corresponding to a top of the second gate on the second gate insulating layer, a material of the second active layer comprising a metal oxide semiconductor;

step S5: forming an etched barrier layer on the second active layer, and forming a first via corresponding to a top of the source contact region of the first active layer and forming a second via corresponding to a top of the drain contact region of the first active layer on the first gate insulating layer and the second gate insulating layer;

step S6: forming a first source on the second gate insulating layer and a source-drain common structural layer and a second drain on the etched barrier layer, the second active layer and the second gate insulating layer;

the first source contacted with the source contact region of the first active layer via the first via; one end of the source-drain common structural layer contacted with the drain contact region of the first active layer via the second via, and the other end directly contacted with one end of the second active layer; the second drain directly contacted with the other end of the second active layer; a hybrid CMOS device being manufactured;

step S7: performing an annealing treatment on the hybrid CMOS device, wherein the annealing treatment is performed in a nitrogen environment, a temperature of the annealing treatment is 300° C. to 400° C., and a period for the annealing treatment is one hour to three hours;

step S8: after performing the annealing treatment, performing a rapid thermal annealing treatment on the hybrid CMOS device to remove hydrogen in the second active layer, wherein the rapid thermal annealing treatment is performed in a nitrogen environment, a temperature of the rapid thermal annealing treatment is 500° C. to 520° C., and a period for the rapid thermal annealing treatment is one minute to five minutes;

wherein in the step S1, the manufacturing method of the first active layer is: depositing an amorphous silicon membrane on the buffer layer, performing a laser annealing treatment on the amorphous silicon membrane to crystallize the amorphous silicon thin film into a low-temperature polycrystalline silicon membrane, etching the low-temperature polycrystalline silicon thin film to obtain the first active layer;

wherein in the step S4, the manufacturing method of the second active layer is: depositing a metal oxide semiconductor thin film on the second gate insulating layer, etching the metal oxide semiconductor thin film to obtain the second active layer;

wherein in the step S2, a P-type heavy doping is performed on the two ends of the first active layer by an ion implantation; and a P-type ions used by the P-type heavy doping is Boron ion;

wherein in the step S5, an etched barrier thin film is formed on the second active layer and the second gate insulating layer; the etched barrier layer is formed by performing a graphic processing on the etched barrier thin film using a lithography process; and the first via and the second via are formed by performing a graphic processing on the first gate insulating layer and the second gate insulating layer using the same lithography process;

wherein in the hybrid CMOS device, the first active layer, the first gate, the first source, and the source-drain common structural layer jointly form a PMOS transistor, and the second active layer, the second gate, the source-drain common structural layer, and the second drain jointly form an NMOS transistor; in the PMOS transistor, the source-drain common structural layer functions as a drain; in the NMOS transistor, the source-drain common structural layer functions as a source.

* * * * *